United States Patent
Castellanos Ortega et al.

(10) Patent No.: US 11,807,937 B2
(45) Date of Patent: Nov. 7, 2023

(54) METHOD AND APPARATUS FOR FORMING A PATTERNED LAYER OF CARBON, METHOD OF FORMING A PATTERNED LAYER OF MATERIAL

(71) Applicant: ASML Netherlands B.V., Veldhoven (NL)

(72) Inventors: Sonia Castellanos Ortega, Leiden (NL); Jan Verhoeven, Kockengen (NL); Joost Wilhelmus Maria Frenken, Leiden (NL); Pavlo Antonov, Valkenburg (NL); Nicolaas Ten Kate, Almkerk (NL); Olivier Christian Maurice Lugier, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/969,088

(22) PCT Filed: Feb. 26, 2019

(86) PCT No.: PCT/EP2019/054680
§ 371 (c)(1),
(2) Date: Aug. 11, 2020

(87) PCT Pub. No.: WO2019/166409
PCT Pub. Date: Sep. 6, 2019

(65) Prior Publication Data
US 2021/0032743 A1    Feb. 4, 2021

(30) Foreign Application Priority Data
Mar. 2, 2018    (EP) ..................... 18159654

(51) Int. Cl.
*C23C 16/04*    (2006.01)
*C23C 16/26*    (2006.01)
(Continued)

(52) U.S. Cl.
CPC ............ *C23C 16/047* (2013.01); *C23C 16/26* (2013.01); *C23C 16/482* (2013.01);
(Continued)

(58) Field of Classification Search
None
See application file for complete search history.

(56) References Cited

U.S. PATENT DOCUMENTS

| | | | |
|---|---|---|---|
| 10,698,312 B2 | 6/2020 | Van Zwol et al. | |
| 2001/0053414 A1* | 12/2001 | Klebanoff | B08B 7/0057 427/255.6 |

(Continued)

FOREIGN PATENT DOCUMENTS

| | | |
|---|---|---|
| CN | 106489084 A | 3/2017 |
| EP | 1 385 051 A1 | 1/2004 |

(Continued)

OTHER PUBLICATIONS

Takami et al. "Catalyst-Free Growth of Networked Nanographite on Si and SiO2 Substrates by Photoemission-Assisted Plasma-Enhanced Chemical Vapor Deposition" (2009). e-Journal of Surface Science and Nanotechnology. vol. 7 p. 882-890 (Year: 2009).*

(Continued)

*Primary Examiner* — Jose I Hernandez-Kenney
(74) *Attorney, Agent, or Firm* — Sterne, Kessler, Goldstein & Fox P.L.L.C.

(57) ABSTRACT

Methods and apparatus for forming a patterned layer of carbon are disclosed. In one arrangement, a selected portion of a surface of a solid structure is irradiated with extreme ultraviolet radiation in the presence of a carbon-containing precursor. The radiation interacts with the solid structure in the selected portion to cause formation of a layer of carbon (Continued)

in the selected portion from the carbon-containing precursor. The layer of carbon is formed in a pattern defined by the selected portion.

6 Claims, 11 Drawing Sheets

(51) Int. Cl.
*C23C 16/48* (2006.01)
*H01L 21/02* (2006.01)
*H01L 29/16* (2006.01)

(52) U.S. Cl.
CPC ...... *C23C 16/483* (2013.01); *H01L 21/02527* (2013.01); *H01L 21/02636* (2013.01); *H01L 29/1606* (2013.01)

(56) References Cited

U.S. PATENT DOCUMENTS

| | | | |
|---|---|---|---|
| 2004/0033699 A1* | 2/2004 | Hector | G21K 1/062 438/763 |
| 2004/0071924 A1 | 4/2004 | Yang et al. | |
| 2007/0138131 A1 | 6/2007 | Burdinski | |
| 2007/0243319 A1* | 10/2007 | Carothers | B82Y 10/00 204/280 |
| 2011/0043774 A1* | 2/2011 | Hembacher | G03F 7/70925 355/30 |
| 2012/0024314 A1* | 2/2012 | Luo | G03F 7/427 134/1.1 |
| 2012/0241069 A1* | 9/2012 | Hofmann | C01B 32/184 156/60 |
| 2012/0261644 A1* | 10/2012 | Dimitrakopoulos | H01L 29/66045 257/29 |
| 2016/0097125 A1* | 4/2016 | Tavares | C09D 161/06 428/407 |
| 2016/0340797 A1* | 11/2016 | Ozyilmaz | C23C 16/483 |
| 2017/0137601 A1 | 5/2017 | Heikkinen et al. | |
| 2017/0148631 A1* | 5/2017 | Beasley | C01B 32/186 |
| 2017/0336716 A1* | 11/2017 | Flagello | G03F 7/70283 |

FOREIGN PATENT DOCUMENTS

JP H05-275259 A 10/1993
KR 10-2017-0023981 3/2017

OTHER PUBLICATIONS

Prezioso et al. "Large Area Extreme-UV Lithography of Graphene Oxide via Spatially Resolved Photoreduction" (2012). Langmuir 28 p. 5489-5495 (Year: 2012).*
Prezioso et al. Combined microscopies study of the C-contamination induced by extreme ultraviolet radiation: A surface-dependent secondary-electron-based model. Appl. Phys. Lett. 100, 201603 (2012), https://doi.org/10.1063/1.4714774 (Year: 2012).*
Gadgil et al. "Graphene vs. reduced graphene oxide: A comparative study of graphene-based nanoplatforms on electrochromic switching kinetics". Carbon 96 (2016) p. 377-381 (Year: 2016).*
Adams et al., "Large-Area Nanopatterning of Self-Assembled Monolayers of Alkanethiolates by Interferometric Lithography," LANGMUIR 2010, vol. 26, No. 16; p. 13600-13606.
Camara et al., "Selective epitaxial growth of graphene on SiC," Applied Physics Letters, vol. 93, No. 12, 123503 (2008); pp. 1-3.
Dharmaraj et al., "Controlled and Selective Area Growth of Monolayer Graphene on 4H-SiC by Electron-Beam-Assisted Rapid Heating," The Journal of Physical Chemistry C, 2013, vol. 117, No. 37; pp. 19195-19202.
Extended European Search report related to European Application No. 18159654.5 dated Nov. 20, 2018; 3 pages.
Emtsev et al., "Interaction, growth, and ordering of epitaxial graphene on SiC{0001} surfaces: A comparative photoelectron spectroscopy study," Physical Review B vol. 77, No. 15, 155303 (2008); pp. 1-10.
Gao et al., "Defect formation in single layer graphene under extreme ultraviolet irradiation," Applied Surface Science, vol. 317, Oct. 30, 2014; pp. 745-751.
Hattori et al., "Direct growth of graphene on SiC(0001) by KrF-excimer-laser irradiation," Applied Physics Letters, vol. 108, No. 9, 093107 (2016); pp. 1-5.
Kruskopf et al., "Comeback of epitaxial graphene for electronics: large-area growth of bilayer-free graphene on SiC," 2D Materials, 3, 041002 (2016): pp. 1-9.
Lemaitre et al., "Low-temperature, site selective graphitization of SiC via ion implantation and pulsed laser annealing," Applied Physics Letters, vol. 100, No. 19, 193105 (2012); pp. 1-4.
Mondelli et al., "High Quality Epitaxial Graphene by Hydrogen-etching of 3C-SiC(111) thin-film on Si(111)," Nanotechnology, vol. 28, No. 11, 115601 (2017); pp. 1-7.
Park et al., "A Facile Route for Patterned Growth of Metal-Insulator Carbon Lateral Junction through One-Pot Synthesis," ACS NANO, vol. 9, No. 8, 2015; pp. 8352-8360.
Park et al., "Fast growth of graphene patterns by laser directing writing," Applied Physics Letters, vol. 98, No. 12, 123109 (2011); pp. 1-3.
Prével et al., "Nanostracturing graphene on SIC by focused ion beam: Effect of the ion fluence," Applied Physics Letters, vol. 9, No. 8, 083116 (2011); pp. 1-3.
Prezioso et al., "Large Area Extreme-UV Lithography of Graphene Oxide via Spatially Resolved Photoreduction," LANGMUIR, vol. 28, No. 12, Mar. 13, 2012; pp. 5489-5495.
Rubio-Roy et al., "Structured epitaxial graphene growth on SiC by selective graphitization using a patterned AlN cap," Applied Physical Letters, vol. 96, No. 8, 082112 (2010); pp. 1-3.
Safron et al., "Barrier-Guided Growth of Micro- and Nano-Structured Graphene," Advanced Materials, vol. 24, No. 8, 2012; pp. 1041-1045.
Sommer et al., "Electron-beam induced nano-etching of suspended graphene," Scientific Reports, 5, 7781, 2015; pp. 1-5.
Turchanin et al., "Fabrication of Molecular Nanotemplates in Self-Assembled Monolayers by Extreme-Ultraviolet-Induced Chemical Lithography," Nanolithography, vol. 3, No. 1, 2007; pp. 2114-2119.
Utke et al., "Gas-assisted focused electron beam and ion beam processing and fabrication," Journal of Vacuum Science & Technology B, vol. 26, No. 4, Jul./Aug. 2008; pp. 1197-1276.
Weber et al., "Direct Growth of Patterned Graphene," small 2016, vol. 12, No. 11; pp. 1440-1445.
International Search Report and Written Opinion of the International Searching Authority directed to related International Application No. PCT/EP2019/054680, dated May 20, 2019; 15 pages.
Zharnikov et al., "Modification of thiol-derived self-assembling monolayers by electron and x-ray irradiation: Scientific and lithographic aspects," Journal of Vacuum Science & Technology B, vol. 20, No. 5, Sep./Oct. 2002; pp. 1793-1807.
Chinese Office Action directed to Chinese Patent Application No. 2019800165452, dated Apr. 4, 2023; 13 pages.

\* cited by examiner

METHOD AND APPARATUS FOR FORMING A PATTERNED LAYER OF CARBON, METHOD OF FORMING A PATTERNED LAYER OF MATERIAL

CROSS-REFERENCE TO RELATED APPLICATIONS

This application claims priority of EP application 18159654.5, which was filed on 2 Mar. 2018 and which is incorporated herein in its entirety by reference.

FIELD

The present invention relates to methods and apparatus for forming a patterned layer of carbon, and to methods of forming a patterned layer of material more generally.

BACKGROUND

Graphene has been proposed as a conductor component in the semiconductor industry. Graphene can be produced in various ways, including for example chemical vapor deposition (CVD) on metal surfaces, and silicon sublimation from SiC. Incorporation of graphene into semiconductor devices requires the graphene to be formed in fine scale patterns. It is challenging, however, to perform such patterning accurately, quickly and at reasonable cost.

Extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm. Resist materials for lithography have been developed based on concepts established for lithography using longer wavelength (e.g. UV) radiation. Thin films of resist materials are deposited by spin-coating, exposed to a projected light pattern, and then developed with a solvent that washes away selectively the exposed (positive tone) or unexposed (negative tone) areas. A patterned layer of material is generated that protects the substrate underneath during subsequent etching processes, thereby transferring the negative image of that pattern to the substrate. For the process to be effective, the resist must undergo chemical changes throughout its whole thickness so that the areas that are soluble after exposure can be fully removed.

There are, however, some important differences between the operation of EUV resists and resists for longer wavelength radiation. One difference is that the chemical reactions in EUV resists are not directly induced by the EUV photons but rather by the electron cascade that the EUV photons induce in the materials. Another difference is that the targeted critical dimensions in EUV lithography are much smaller. This means that lower thicknesses are needed in EUV resists in order to avoid high aspect ratio features, which would be prone to collapse or deformation. Typically, practical thicknesses should ideally be less than about 20-30 nm. The low thickness of EUV resists means their absorptivity must be relatively high to ensure absorption of enough photons to transfer the intended pattern efficiently. Furthermore, EUV lithography systems aim at smaller critical dimensions by increasing numerical aperture (NA) (e.g. from 0.33 to 0.5), which decreases depth of focus and potentially limits how uniformly the EUV radiation will be absorbed by the EUV resist. The future tend is to keep decreasing the photoresist layer thickness, which lowers the photon absorption and leads to higher shot noise. These effects can have a negative impact on roughness and can contribute to the generation of defects.

SUMMARY

It is an object of the invention to provide alternative or improved methods and apparatus for forming patterned layers of carbon and/or for forming patterned layers of material more generally.

According to one aspect, there is provided a method of forming a patterned layer of carbon, comprising: irradiating a selected portion of a surface of a solid structure with extreme ultraviolet radiation in the presence of a carbon-containing precursor, wherein: the radiation interacts with the solid structure in the selected portion to cause formation of a layer of carbon in the selected portion from the carbon-containing precursor, the layer of carbon being thereby formed in a pattern defined by the selected portion.

The method allows patterned layers of carbon to be formed without requiring the high temperatures associated with alternative techniques such as CVD or silicon sublimation from SiC. The method allows patterns to be formed without needing a resist overlayer to peel away the graphene layer from the substrate where it was grown, to be transferred to the surface where it is to be applied. No closed layer of graphene needs to be formed prior to patterning. The mechanism of interaction between the extreme ultraviolet (EUV) radiation and the solid structure allows the carbon to be formed at high speed, thereby providing good throughput. The short wavelength of the EUV provides high spatial resolution.

In an embodiment, the irradiation generates photo-electrons from the solid structure; the photo-electrons catalyse a reaction involving the carbon-containing precursor; and the reaction causes the formation of the layer of carbon by deposition. This mechanism allows the carbon layer to be formed quickly and efficiently.

In an embodiment, the carbon-containing precursor comprises a gas. The patterned layer of carbon can thus be formed without any separate deposition steps (e.g. deposition of a closed layer of graphene or deposition of a solid precursor material).

In an embodiment, the carbon-containing precursor comprises a solid-state film on the surface of the solid structure. Using a solid-state precursor provides increased processing flexibility. The patterned layer of carbon can be formed without necessarily needing to provide a carbon-containing precursor in gaseous form.

According to an aspect, there is provided an apparatus for forming a patterned layer of carbon, comprising: an irradiation system configured to irradiate a selected portion of a surface of a solid structure with extreme ultraviolet radiation; and an environment control system configured to control an environment including the selected portion of the surface of the solid structure such that the selected portion can be irradiated in the presence of a gaseous carbon-containing precursor.

In an embodiment, the irradiation system comprises a lithographic apparatus configured to provide the irradiation of the selected portion of the solid structure by projecting a patterned radiation beam from a patterning device onto the solid structure.

Thus, capabilities of lithography apparatus developed to achieve high precision exposure of resist can be exploited to allow accurate formation of patterns in a layer of carbon without requiring processing of a resist.

According to an aspect, there is provided a method of forming a patterned layer of material, comprising: irradiating with extreme ultraviolet radiation a selected region of an absorption layer and a monolayer of material formed on the absorption layer, wherein: the radiation interacts with the absorption layer to generate either or both of photo-electrons and hot electrons at an interface between the monolayer of material and the absorption layer that modify the monolayer of material in the selected region; and the method further comprises using a difference in properties in the selected region caused by the modification to form a barrier layer on the monolayer of material in a pattern defined by the selected region.

This approach allows functionality equivalent to a traditional photoresist to be provided in an arrangement in which the roles of absorbing radiation, providing chemical contrast, and providing etch resistance are separated between different materials, thereby provided enhanced flexibility for optimization. Furthermore, the effective thickness of the photoresist is reduced to the thickness of a monolayer or interface region, thereby reducing or avoiding negative effects from small depth of focus.

BRIEF DESCRIPTION OF THE DRAWINGS

Embodiments of the invention will now be described, by way of example only, with reference to the accompanying schematic drawings, in which.

DETAILED DESCRIPTION

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Figure 1:
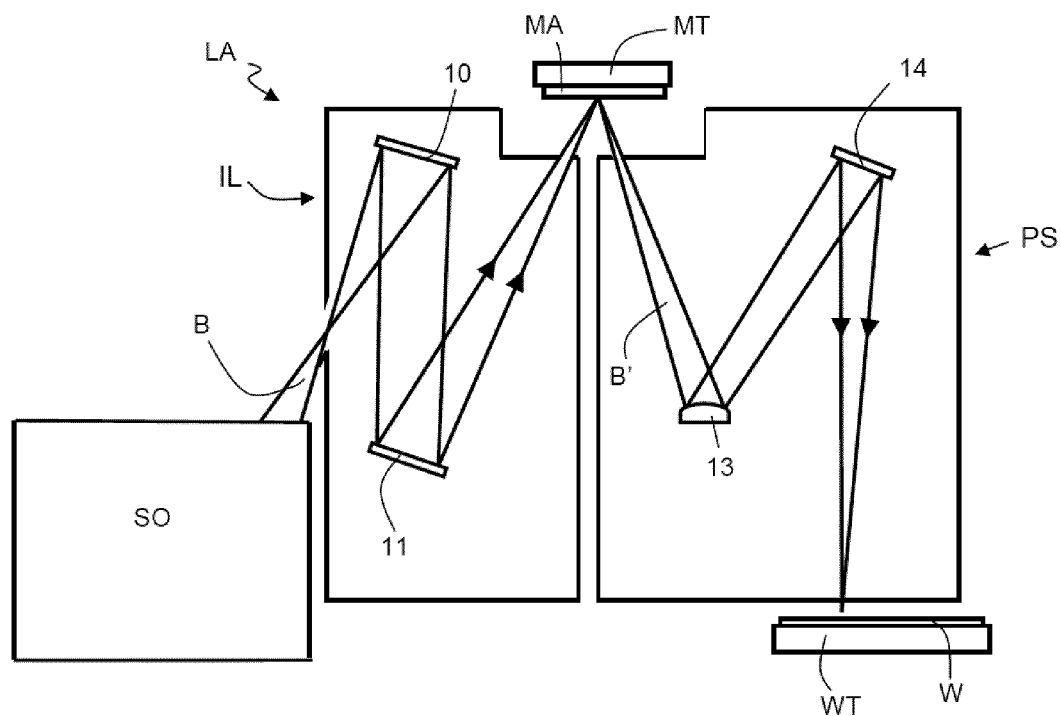
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

Figure 2:
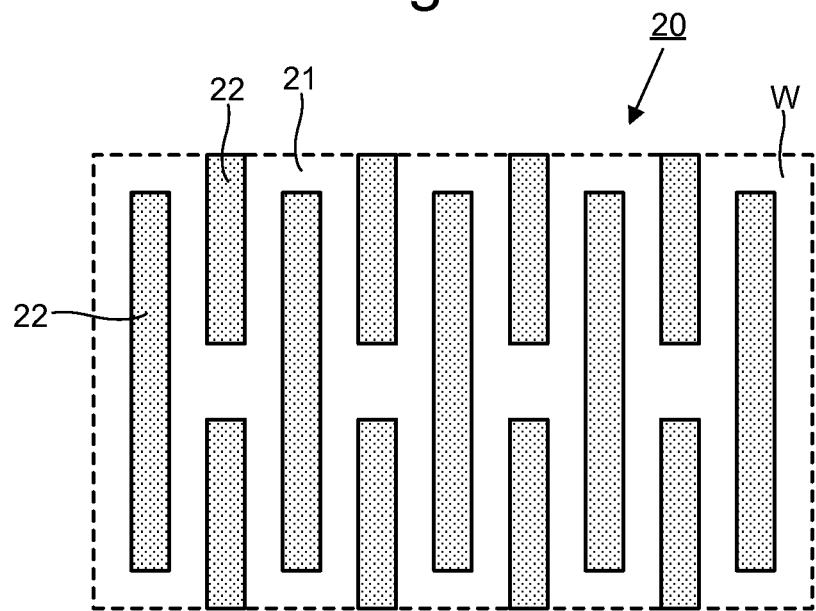
FIG. 2 is a schematic top view of a region of a surface containing an irradiated selected portion.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 2, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W. As described below, the substrate W may also comprise a solid structure onto which a patterned layer of carbon is to be formed.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

As described in the introductory part of the description, patterned layers of graphene may be used in devices such as semiconductors. Embodiments of the present disclosure provide alternative or improved methods or apparatus for forming patterned layers of carbon, including patterned layers of graphene.

According to an embodiment, a method of forming a patterned layer of carbon is provided in which a selected portion 22 of a surface 20 of a solid structure is irradiated. In some embodiments, the selected portion 22 defines the shape of one or more portions of a device to be manufactured. An example region on a surface 20 of a solid structure during irradiation is depicted schematically in FIG. 2. The shaded rectangular regions are the selected portion 22 being irradiated. The region 21 outside of the selected portion 22 is not being irradiated.

The irradiation comprises irradiation with EUV radiation. In some embodiments, the EUV radiation comprises radiation having a wavelength in the range of 4 nm to 20 nm, for example 6.7 nm or 13.5 nm.

Figure 3:
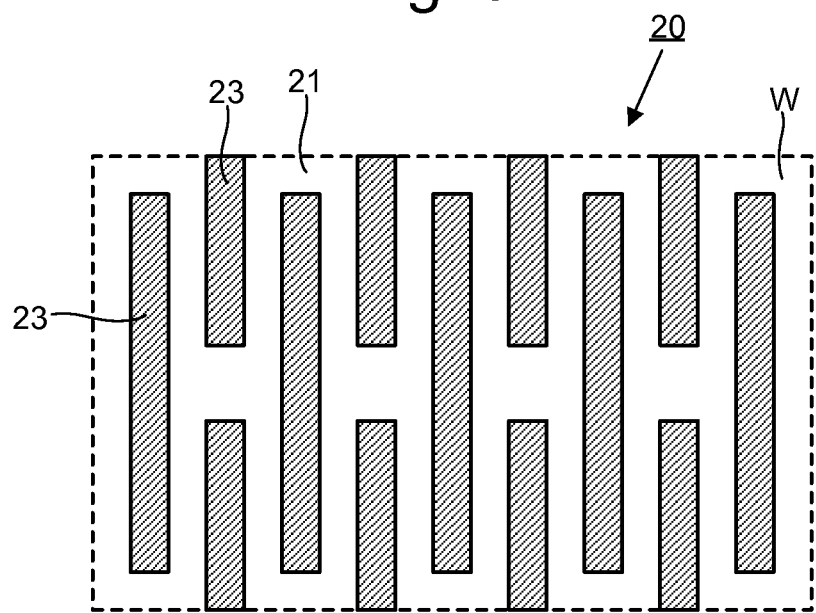
FIG. 3 depicts the region of FIG. 2 after formation of a layer of carbon in the selected portion.

The irradiation is performed in the presence of a carbon-containing precursor. The irradiation interacts with the solid structure in the selected portion 22 to cause formation of a layer of carbon 23 in the selected portion 22 from the carbon-containing precursor. FIG. 3 depicts such a layer of carbon 23 formed due to the irradiation depicted in FIG. 2. The layer of carbon 23 is formed in a pattern defined by the selected portion 22. In some embodiments, the layer of carbon 23 is formed in a pattern that substantially or exactly overlies the selected portion 22, such that the selected portion 22 is substantially or completed covered by the layer of carbon 23. In some embodiments, none of the region 21 outside of the selected portion 22 is covered by the layer of carbon 23. The irradiation thus patterns the layer of carbon 23.

In some embodiments, the layer of carbon 23 formed by the irradiation comprises, consists essentially of, or consists of, graphene.

In some embodiments, the carbon-containing precursor comprises, consists essentially of, or consists of, a gas. FIGS. 4-7 schematically depict steps in an example method where the precursor is gaseous.

Figure 4:
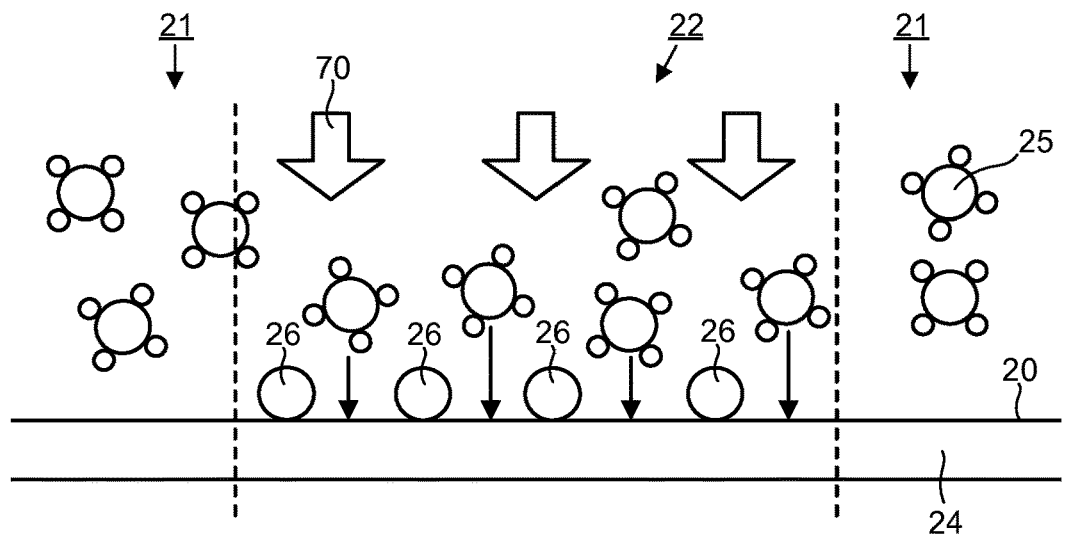
FIG. 4 is a schematic side sectional view depicting irradiation of a selected portion of a surface to causes dissociation of precursor molecules and adsorption of carbon in the selected portion.

FIG. 4 depicts irradiation 70 of a selected portion 22 of a surface 20 of a solid structure 24 in the presence of a gaseous carbon-containing precursor 25 (e.g. methane, as depicted schematically). The irradiation 70 causes adsorption of carbon atoms 26 onto the selected portion 22 of the surface 20 and not onto the region 21 of the surface 20 outside of the selected portion 22.

Figure 5:
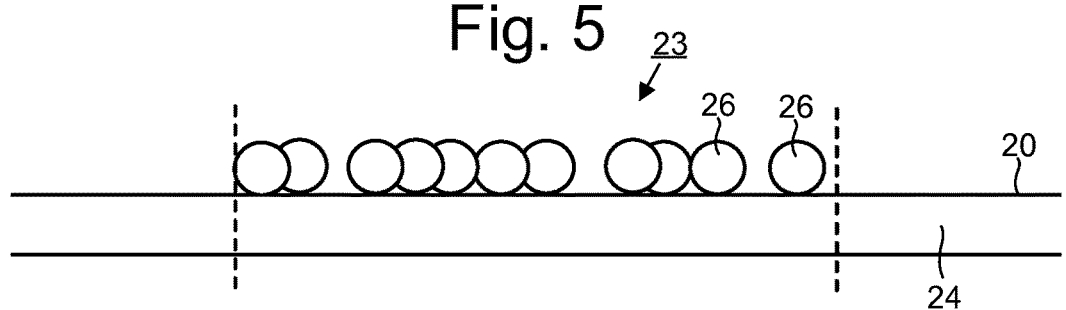
FIGS. 5 and 6 are schematic side sectional views depicting progression of the process of FIG. 4 to form graphene in the selected portion.
Figure 6:
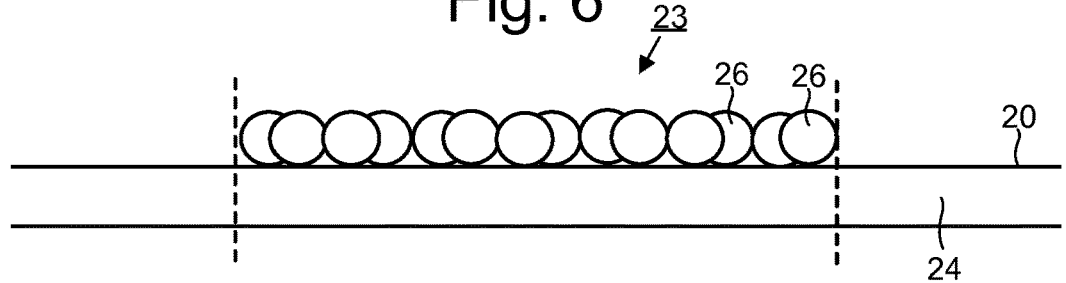
Figure 7:
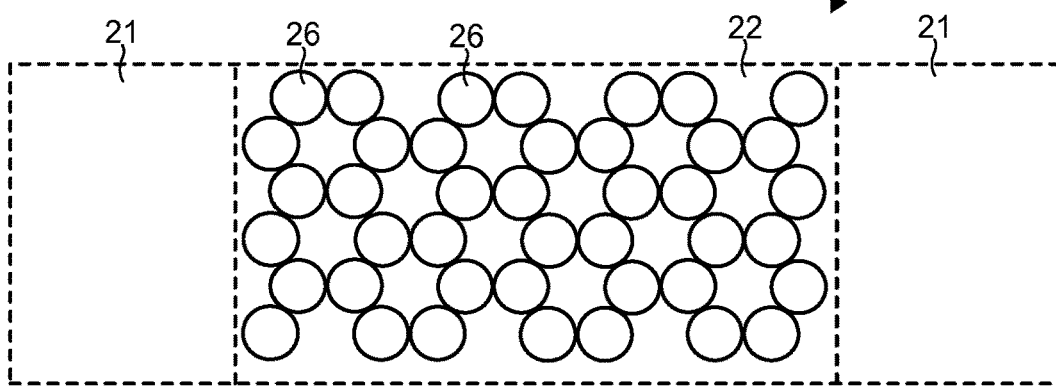
FIG. 7 is a schematic top view of the arrangement of FIG. 6.

FIGS. 5 and 6 show schematically how the process of FIG. 4 can build up a layer of carbon 23 on the surface 20. In some embodiments, the layer of carbon 23 forms graphene. FIG. 7 schematically depicts a monolayer of carbon atoms 26 forming graphene in the selected portion 22 of the surface 20.

In some embodiments, the carbon-containing precursor comprises, consists essentially of, or consists of, a hydrocarbon. In some embodiments, the carbon-containing precursor comprises, consists essentially of, or consists of, one or more of the following: one or more alkanes (e.g. methane, ethane, propane); one or more alkynes (e.g. ethyne, methyne, propyne).

In some embodiments, the irradiation generates photo-electrons from the solid structure 24. The photo-electrons catalyse a reaction involving the carbon-containing precursor. The reaction causes the formation of the layer of carbon by deposition. In some embodiments, including the embodiment of FIGS. 4-7, the photo-electrons catalyse a reaction leading to dissociation of the carbon-containing precursor and adsorption of carbon to the surface 20 in the selected region 22. The use of photoelectrons in this manner allows the patterned layer of carbon 23 to be formed in a single step (i.e. without separate irradiation and deposition steps). The layer of carbon 23 is formed at the same time as the irradiation.

In such embodiments, the energy release caused by EUV interaction with the solid structure 24 generates the photo-electrons. Some of these photo-electrons may be energetic enough to fully escape the system, but a portion of the photo-electrons have energies that are too low to fully escape. These lower energy electrons may be referred to as hot electrons. The inventors have found that the irradiation produces a large enough amount of the hot electrons to efficiently catalyse reactions that cause carbon to be deposited on the surface 20 from the carbon-containing precursor.

In some embodiments, the patterned layer of carbon 23 directly forms as graphene. In other embodiments, the patterned layer of carbon 23 does not directly form graphene but provides a solid precursor for subsequent graphene formation. The solid precursor may comprise a mixture of different phases of carbon, for example.

In some embodiments, low energy secondary electrons produced by the irradiation of the solid structure 24 provide heating near the surface 20 of the solid structure 24 and thereby also contribute to graphene formation.

In an embodiment, a subsequent heating process is applied to the patterned layer of carbon 23. In a case where the patterned layer of carbon 23 comprises graphene, the subsequent heating process may cause a quality (e.g. purity, average grain size, and/or homogeneity) of the graphene to be improved. In a case where the patterned layer of carbon 23 comprises a solid precursor for subsequent graphene formation, the subsequent heating may transform the layer of carbon 23 into graphene. The duration and temperature profile of the subsequent heating is chosen to achieve the desired effect. In some embodiments, the subsequent heating may be performed, for example, at temperatures in the range of about 600-1000° C., optionally in the range of 700-900° C., optionally in the range of 750-850° C., optionally around 800° C.

A range of compositions of solid structure can provide photo-electrons suitable for catalysing a reaction that can lead to deposition of carbon from the carbon-containing precursor. For example, photo-electrons generated at levels of the order of 10s of eV below the Fermi level by the irradiation will undergo sufficient energy loss to appear at the surface 20 as electrons with suitable energy to contribute to deposition of carbon from the carbon-containing precursor. In some embodiments, the solid structure comprises one or more of the following: a metal, a metal carbide, a metal oxide, a semiconductor, Si, $SiO_2$ and SiC.

In an embodiment, the carbon-containing precursor comprises a solid-state film 27 on the surface 20 of the solid structure. The solid-state film 27 may be formed by any suitable process. In some embodiments, the solid-state film 27 is formed by atomic layer deposition. In some embodiments, the solid-state film 27 comprises pentacene. Pentacene can be deposited for example by evaporation from a heated container containing a source of pentacene. In some embodiments, the solid-state film 27 comprises polystyrene. Polystyrene can be deposited for example by spin coating. In some embodiments, the solid-state film 27 comprises carbon-containing aromatic precursor molecules (formed for example using atomic layer deposition), optionally forming self-assembled layers on the surface 20 (e.g. a copper surface) of the solid structure.

Figure 8:
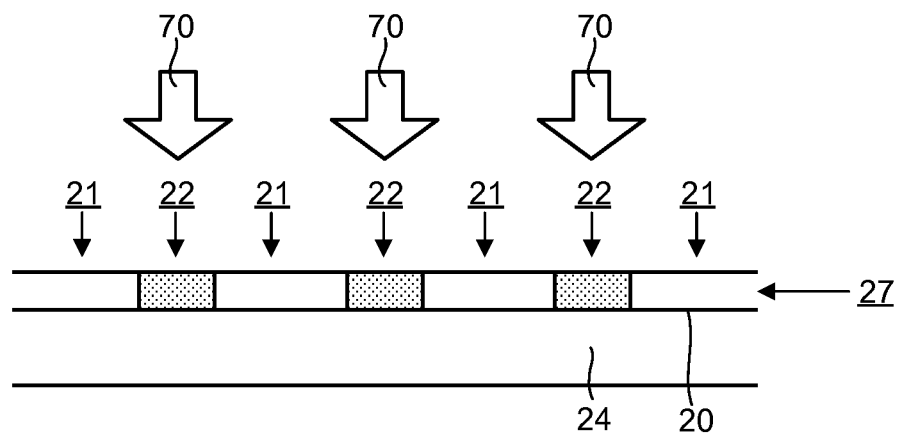
FIG. 8 is a schematic side sectional view depicting irradiation of a selected portion of a surface on which the carbon-containing precursor is provided as a solid-state film.

In an embodiment, as depicted schematically in FIG. 8, the irradiation 70 transforms the solid-state film 27 in the selected portion 22 into an intermediate state (depicted by shading in FIG. 8). In an embodiment, the intermediate state is transformable into graphene by subsequent heating.

Figure 9:
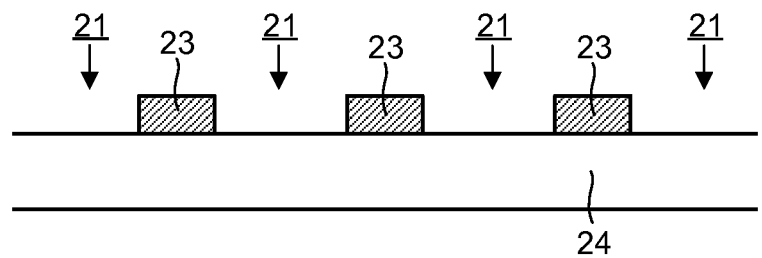
FIG. 9 depicts the arrangement of FIG. 8 after a subsequent heating process to transform an irradiated portion of the solid-state film to graphene and to remove a non-irradiated portion of the solid-state film.

In an embodiment, as depicted schematically in FIG. 9, the irradiated solid-state film 27 is subjected to the subsequent heating. The subsequent heating transforms the irradiated solid-state film 27 in the selected portion 22 into graphene, thereby providing a layer of graphene 23 in a pattern defined by the irradiation. The duration and temperature profile of the subsequent heating is chosen to achieve the desired effect. In some embodiments, the subsequent heating may be performed, for example, at temperatures in the range of about 600-1000° C., optionally in the range of 700-900° C., optionally in the range of 750-850° C., optionally around 800° C.

In an embodiment, the irradiation induces cross-linking in the solid-state film 27 in the selected portion 22. In an embodiment, the cross-linking makes the solid-state film 27 in the selected portion 22 more resistant to conditions present in the subsequent heating than the solid-state film 27 in the region 21 outside of the selected portion 22. In an embodiment, the subsequent heating process removes the solid-state film 27 in the region 21 outside of the selected portion 22 (as depicted in FIG. 9). In an embodiment, the subsequent heating is performed in the presence of atomic hydrogen. The atomic hydrogen acts to selectively clean away the solid-state film 27 where the solid-state film 27 has not been irradiated.

Figure 10:
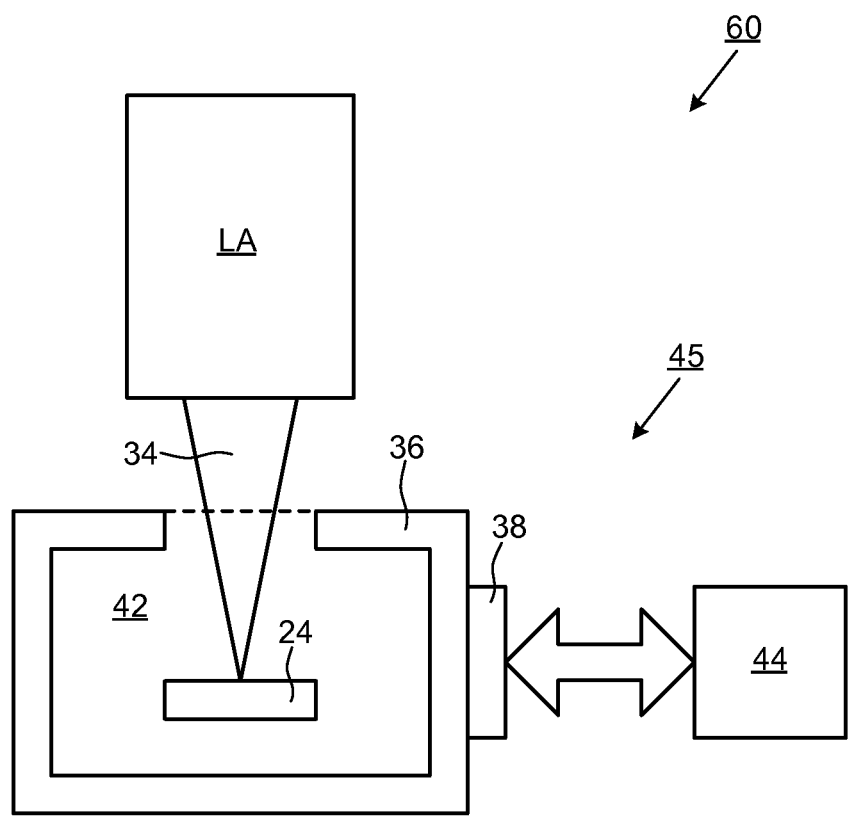
FIG. 10 schematically depicts an apparatus comprising an irradiation system and an environment control system.

FIG. 10 schematically depicts an apparatus 60 for performing the above-described methods. The apparatus 60 thus forms a patterned layer of carbon 23. The apparatus 60 comprises an irradiation system. The irradiation system is configured to irradiate the selected portion 22 with EUV radiation. The irradiation system may comprise a lithographic apparatus LA. The lithographic apparatus LA irradiates the selected portion 22 by projecting a patterned radiation beam 34 from a patterning device MA onto the solid structure 24. The lithographic apparatus LA may be configured as described above with reference to FIG. 1, for example. The solid structure 24 and any solid-state layers 27 on the solid structure 24 may be provided at the position of the substrate W discussed above with reference to FIG. 1.

In an embodiment, an environment control system 45 is provided. The environment control system 45 allows the composition of the environment 42 above the solid structure 24 to be controlled in such a way as to allow the formation of the patterned layer of carbon to proceed. In an embodiment, the environment control system 45 is configured to allow the selected portion 22 to be irradiated in the presence of a gaseous carbon-containing precursor. In an embodiment, the environment control system 45 comprises a chamber 36 to provide a sealed environment 42 including the selected portion 22 of the surface of the solid structure 24. In some embodiments, the chamber 36 will be filled with the gaseous carbon-containing precursor during the irradiation. In some embodiments, all of the solid structure 24 will be within the chamber 36 during the formation of the layer of carbon 23. In an embodiment, a materials exchange system 38 (e.g. a port into the chamber 36 and associated valves and/or conduits) is provided that allows materials to be added to and removed from the sealed environment 42 to allow different compositional environments to be established within the sealed environment 42. Materials may be provided to and from the materials exchange system 38 by a flow manager 44. The flow manager 44 may comprise any suitable combination of reservoirs, ducting, valves, sinks, pumps, control systems, and/or other components necessary to provide the required flows of materials into and out of the chamber 36. In some embodiments, the materials added to and removed from the chamber 36 are gaseous, thereby providing compositional environments consisting of different combinations of gases.

In some embodiments, including embodiments in which the carbon-containing precursor is gaseous, the apparatus 60 can form the patterned layer of carbon in a single step, as mentioned above. In other embodiments, including embodiments in which the carbon-contained precursor is at least partially provided as a solid-state film, one or more additional steps may be needed to deposit the solid-state film. In some embodiments, the deposition may be performed within the environment control system (e.g. by evaporation). In other embodiments, the deposition may be performed outside of the environment control system (e.g. using an apparatus separate from the apparatus 60), for example where deposition is performed using spin coating.

As mentioned in the introductory part of the description, EUV lithography presents challenges for resist design. Embodiments described below address these challenges.

In a class of embodiments, examples of which are described below and respectively illustrated in FIGS. 11-14, FIGS. 15-19, and FIGS. 20-22, a method of forming a patterned layer of material is provided.

Figure 11:
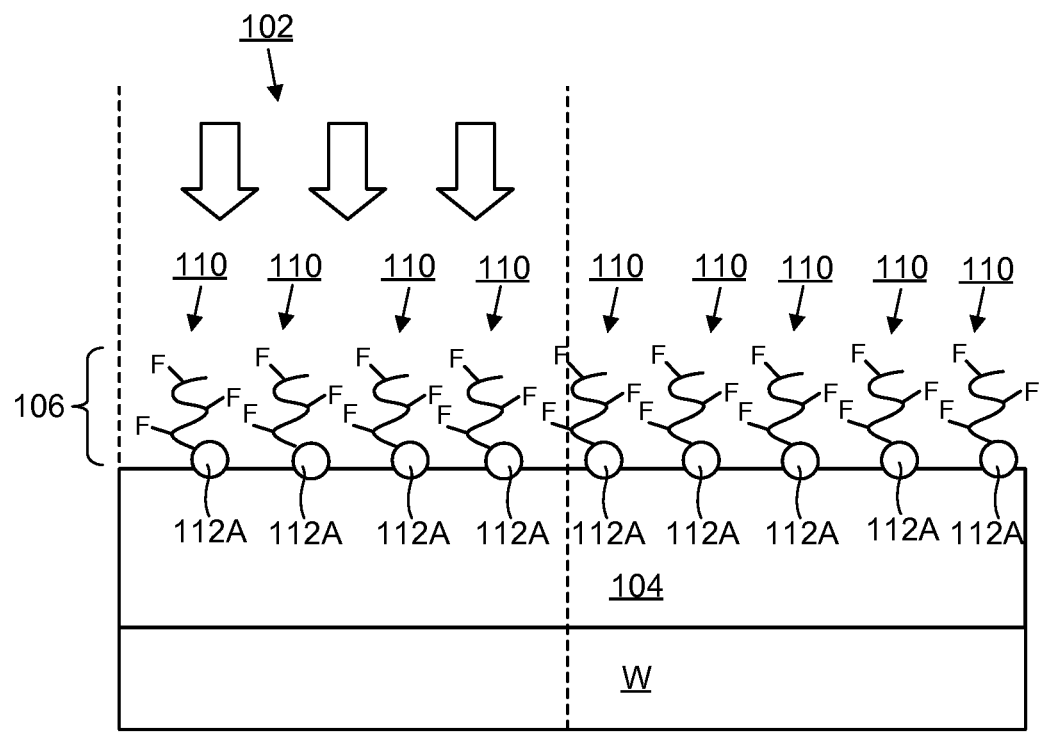
FIG. 11 is a schematic side sectional view depicting irradiation of a selected region of an absorption layer and monolayer of material according to an embodiment.
Figure 12:
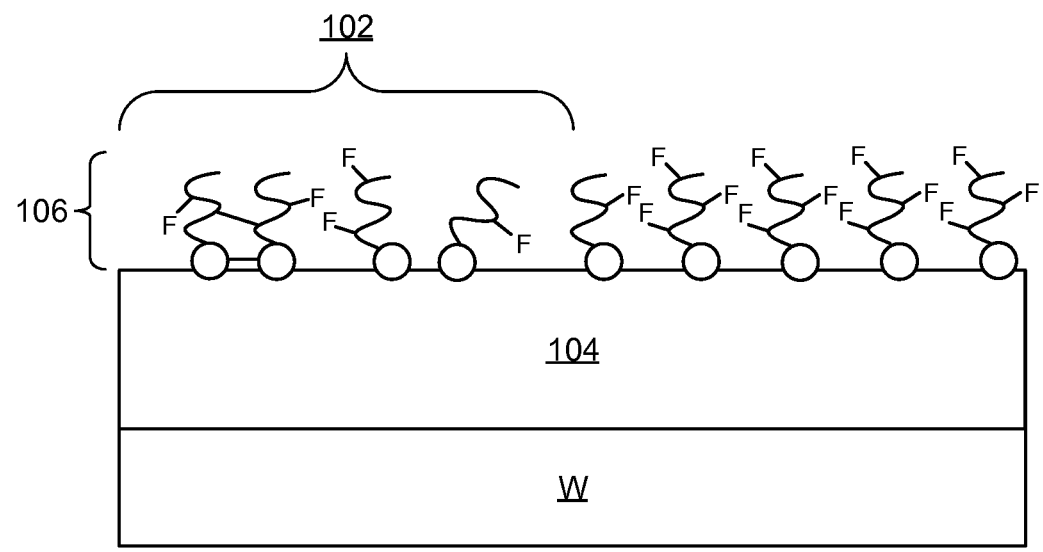
FIG. 12 is a schematic side sectional view of the arrangement of FIG. 11 after the irradiation, with the monolayer of material being damaged within the selected region.
Figure 15:
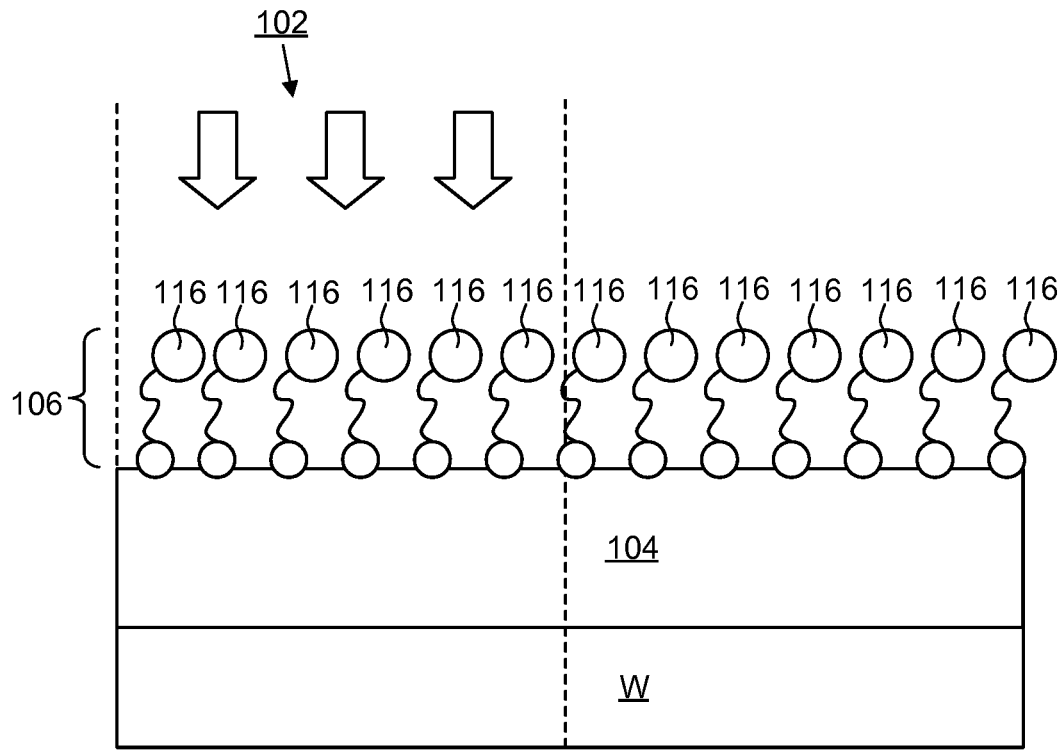
FIG. 15 is a schematic side sectional view depicting irradiation of a selected region of an absorption layer and monolayer of material according to an alternative embodiment.
Figure 20:
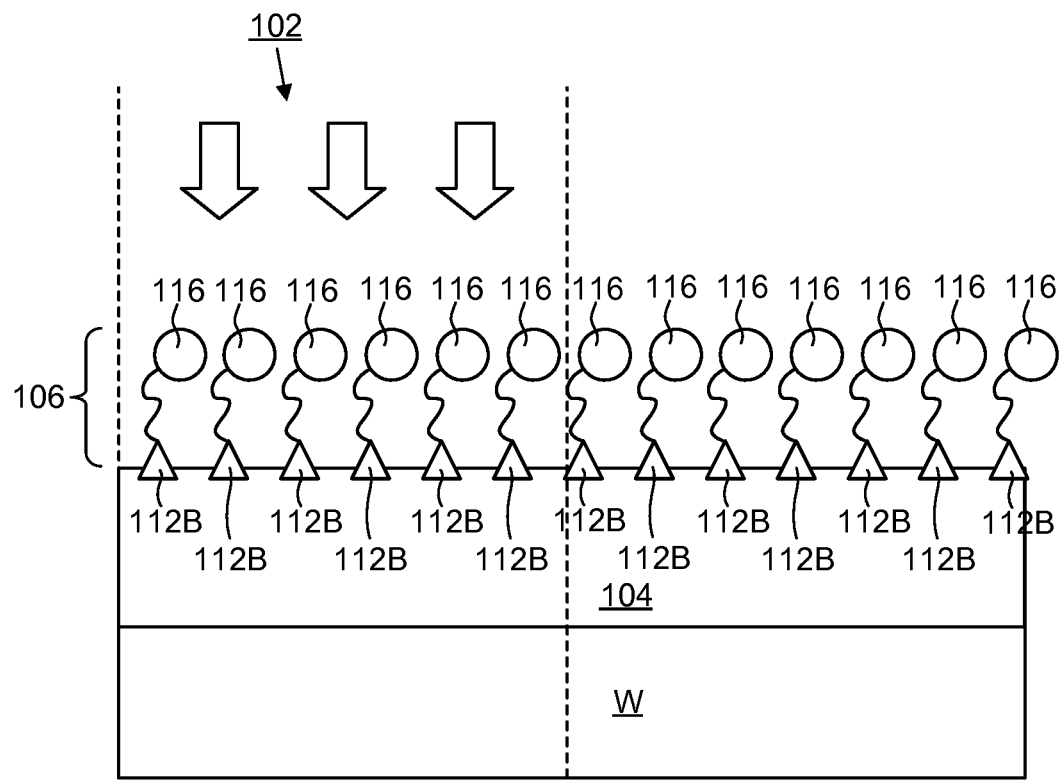
FIG. 20 is a schematic side sectional view depicting irradiation of a selected region of an absorption layer and monolayer of material according to an alternative embodiment.

As depicted in FIGS. 11, 15 and 20, the method comprises irradiating with EUV radiation a selected region 102 (the region between vertical broken lines in the figures) of an absorption layer 104 and a monolayer of material 106 formed on the absorption layer 104. In some embodiments, the monolayer of material 106 comprises, consists essentially of, or consists of a self-assembled monolayer (SAM). In some embodiments, the absorption layer 104 comprises, consists essentially of, or consists of one or both of the following: a metal and a metal oxide. The absorption layer 104 is provided on a substrate W. The radiation interacts with the absorption layer 104 to generate photo-electrons and/or hot electrons at an interface between the monolayer of material 106 and the absorption layer 104. The generated photo-electrons and/or hot electrons modify the monolayer of material 106 in the selected region 102, for example by damaging the monolayer of material 106. The damage may comprise introducing defects, increasing disorder and/or breaking bonds or otherwise weakening the monolayer of material 106.

The method further comprises using the difference in properties in the selected region 102 caused by the modification to form (e.g. grow) a barrier layer 111 on the monolayer of material 106 in a pattern defined by the selected region 102. The patterned barrier layer 111 can be used in subsequent processing steps to form a patterned layer of material. For example, the patterned layer of material may be formed via an etching process in which the absorption layer 104 is removed where the barrier layer 111 is absent and is not removed where the barrier layer 104 is present.

In some embodiments, examples of which are described below with reference to FIGS. 11-22, the monolayer of material 106 comprises a plurality of organic molecules each having an anchoring functional group 112A (labelled in FIGS. 11 and 13) and 112B (labelled in FIG. 20). The anchoring functional group 112A,112B is a functional group effective to attach the organic molecules to the absorption layer 104.

In some embodiments, such as the embodiments described below with reference to FIGS. 11-19, the absorption layer 104 comprises a metal and the anchoring functional group 112A comprises a thiol group (e.g. an —SH group). Organic molecules comprising thiol groups may be referred to as thiol molecules. The thiol group has a strong affinity towards metals, particularly Au or Ag. In a class of embodiments, the absorption layer 104 comprises, consists essentially of, or consists of one or more of Au, Ag, Cd, Zn and Cu, and the anchoring functional group 112A comprises a thiol group. The thiol group forms reversible covalent bonds (e.g. Au—S) in such embodiments.

In some embodiments, such as the embodiments described below with reference to FIGS. 20-22, the absorption layer 104 comprises a metal oxide. In an embodiment, the metal oxide comprises, consists essentially of, or consists of one or more of the following: indium oxide, tin oxide, indium tin oxide, and titanium oxide. These metal oxides have high EUV photon absorption cross-sections (e.g. containing metals with EUV photon absorption cross-sections above $1\times10^6$ cm$^2$/mol or yielding a linear absorption coefficient above 20 um$^{-1}$). Other metal oxides having similarly high EUV photon absorption cross-sections may be used or other compounds may be used (e.g. other compounds containing metals with EUV photon absorption cross-sections above $1\times10^6$ cm$^2$/mol or yielding a linear absorption coefficient above 20 um$^{-1}$). In cases where the EUV absorption layer 104 comprises a metal oxide, a different anchoring functional group 112B will normally be necessary, relative to the case where the absorption layer 104 comprises a metal, to provide the necessary attachment to the absorption layer 104. In one embodiment, for example, a silane group is used as the anchoring functional group 112B instead of using a thiol group as the anchoring functional group 112A.

In some embodiments, such as the embodiments described below with reference to FIGS. 11-14, the formation of the barrier layer 111 comprises replacing a first material 110 in the monolayer of material 106 in the selected region 102 with a second material 114. The replacement is favoured in the selected region 102 by the modification of the monolayer of material 106 in the selected region 102.

Figure 13:
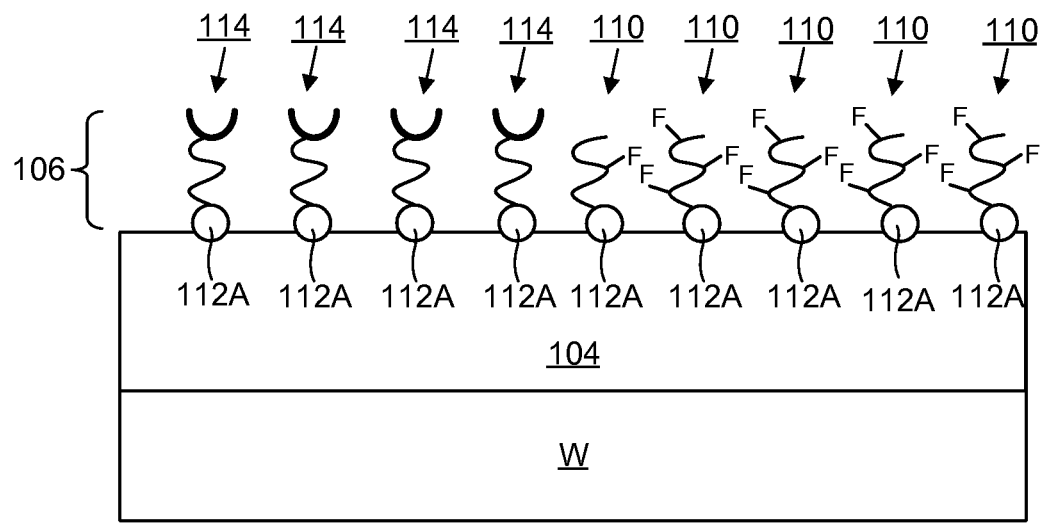
FIG. 13 is a schematic side sectional view of the arrangement of FIG. 12 after first material in the selected region has been replaced by second material.
Figure 14:
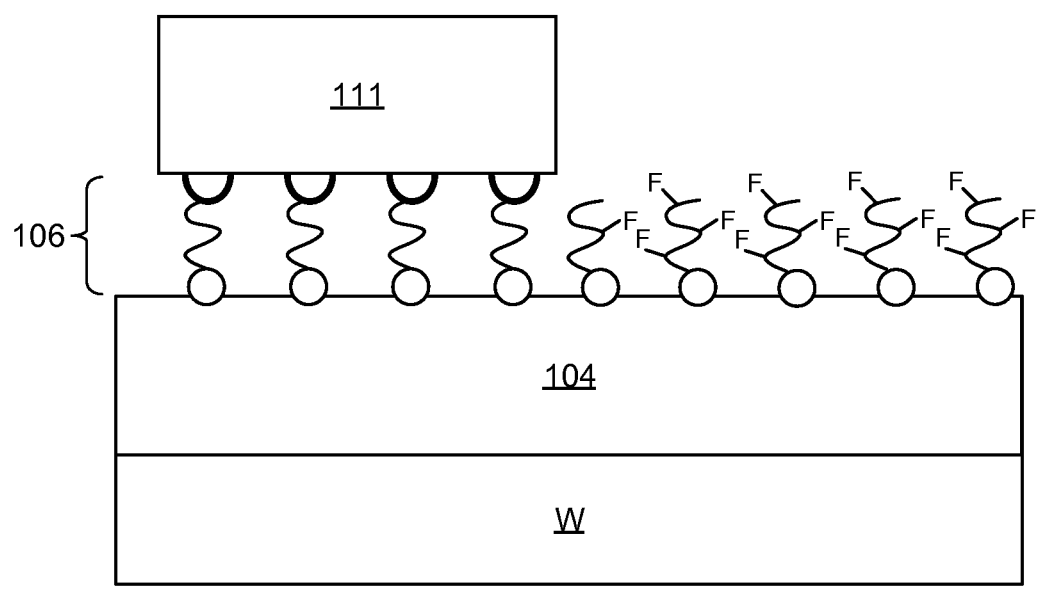
FIG. 14 is a schematic side sectional view of the arrangement of FIG. 13 after growth of a barrier layer 111 in the selected region.

In a first step, as depicted in FIG. 11, the selected region 102 of the absorption layer 104 and the monolayer of material 106 are irradiated by EUV radiation. Without wishing to be bound by theory, it is believed that most of the EUV radiation is absorbed in the absorption layer 104 and photo-electrons, and/or hot electrons at the interface between the monolayer of material 106 and the absorption layer 104, generated by the EUV radiation induce chemical changes in the monolayer of material 106 in the selected region 102, as depicted schematically in FIG. 12. The monolayer of material 106 is damaged in the selected region 102. The damage may include cleaving of some of the bonds between the first material 110 and the absorption layer 104 or other weakening of the attachment between the first material 110 and the absorption layer 104. In a second step, the first material 110 is replaced by the second material 114 in the selected region 102, as depicted schematically in FIG. 13. In an embodiment, the first material 110 and the second material 114 comprise organic molecules having different terminal functional groups. In an embodiment, the first material 110 and the second material 114 comprise organic molecules having the same anchoring functional group 112A (as depicted in FIG. 13). In the example depicted in FIGS. 11-14, the first material 110 and the second material 114 may both comprise thiol molecules to bond efficiently to the absorption layer 104 (which may comprise a metal such as Au or Ag). In an embodiment, the replacement of the first material 110 with the second material 114 is performed by immersion in a solution containing the second material 114. Thus, the post exposure arrangement of FIG. 12 may be immersed in a solution containing thiol molecules with different terminal functional groups than those present in the first material 110 originally. The damaged thiol molecules of the first material 110 in the selected region 102 are washed off and replaced by thiol molecules of the second material 114 from the solution. In embodiments of this type, the formation of the barrier layer 111 may comprise performing a growth process in which either: the barrier layer 111 grows on the first material 110, as depicted in FIG. 14, and not on the second material 114 (e.g. because material forming the barrier layer 111 has greater affinity for the functionalization present in the first material 110 than the second material 114); or the barrier layer 111 grows on the second material 114 and not on the first material 110.

The example of FIGS. 11-14 shows an arrangement that may be used for demonstrating efficacy visually. In this example, the first material 110 comprises fluorinated thiols, which are hydrophobic. If the second material 114 comprises hydrophilic thiols, visualization of the chemical contrast provided in the arrangement of FIG. 13 can be achieved by wetting the arrangement with ethanol. When this is done, clear patterns were observed to be visible to the naked eye at EUV doses of 25 mJ/cm$^2$. The low dose requirement might arise because C—F bonds are easily cleaved by photo-electrons. Other experiments indicated that damage is induced at doses as low as 9 mJ/cm$^2$. The targeted doses in the semiconductor industry roadmap are below 20 mJ/cm$^2$.

Figure 16:
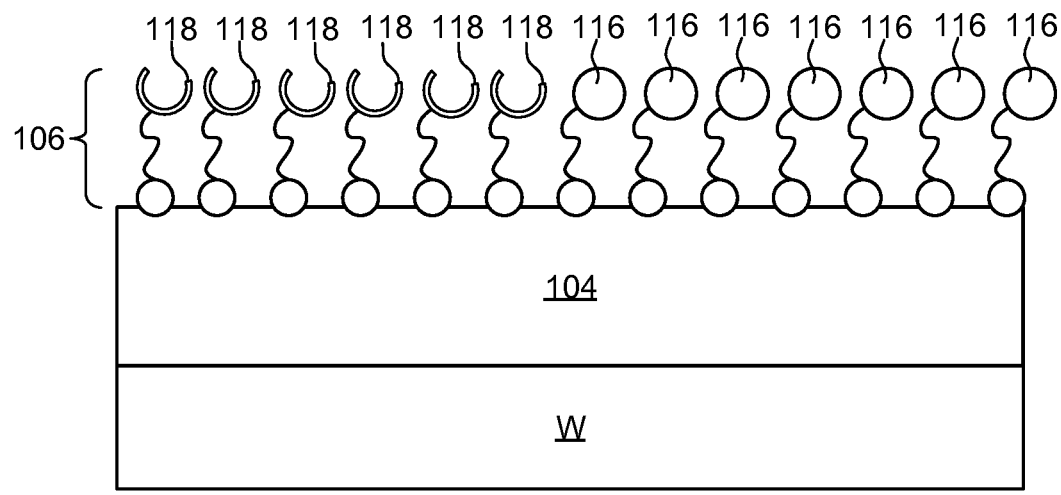
FIG. 16 is a schematic side sectional view of the arrangement of FIG. 15 after the irradiation, with the monolayer of material being modified to remove capping functional groups from organic molecules in the selected region.
Figure 17:
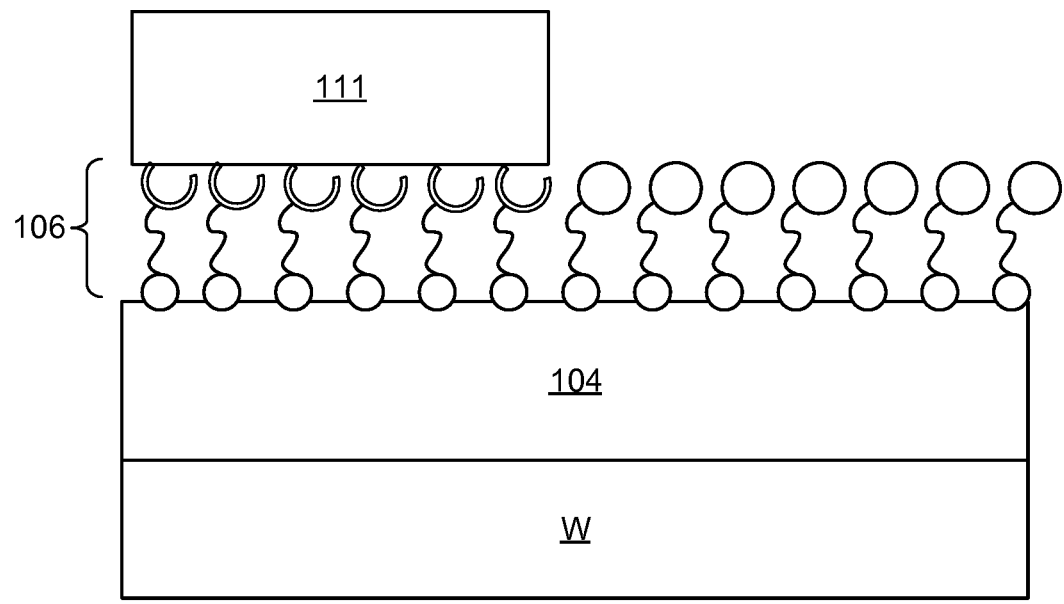
FIG. 17 is a schematic side sectional view of the arrangement of FIG. 16 after growth of a barrier layer 111 in the selected region.

FIGS. 15-17 depict a variation in which the monolayer of material 106 comprises a plurality of organic molecules that each have a capping functional group 116 (see FIG. 15). In embodiments of this type, the modification by the electrons comprises removing the capping functional group 116 from at least a subset of the organic molecules in the selected region 102 to provide the arrangement in FIG. 16. Materials associated with the removed capping functional group 116 are in many cases volatile or easily washed away with solvent. No processing of the type described above with reference to FIG. 13 is thus required (e.g. thiol exchange in solution). In the example shown, the terminal group 118 remains after removal of the capping functional group 116. The formation of the barrier layer 111 comprises performing a growth process in which the barrier layer 111 grows preferentially in the selected region 102 due to interaction with organic molecules from which the capping functional group 116 has been removed (in this case to expose the terminal functional group 118), as depicted in FIG. 17. In an embodiment, the preferential growth comprises selective deposition of either or both of metal-containing and metal-organic hybrid materials in the selected region 102. In an embodiment, the interaction with organic molecules from which the capping functional group has been removed comprises interaction with one or more of the following terminal functional groups having affinity for metallic species: carboxylates; phosphates; sulfonates; and amine-based groups such as amines, pyridine, and piperidine.

Figure 18:
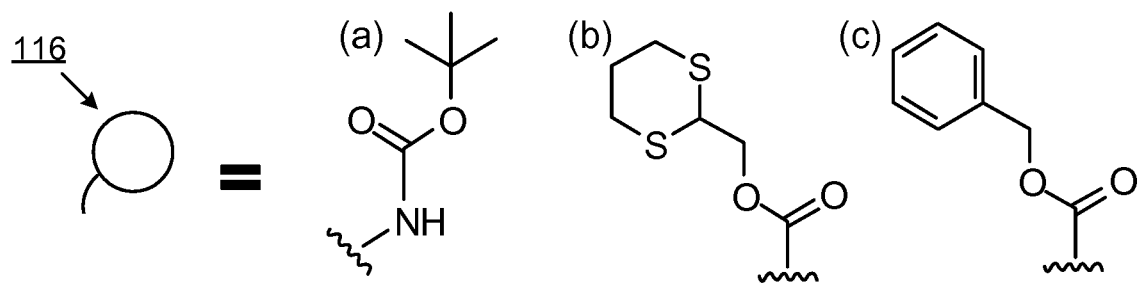
FIG. 18 depicts three example terminal groups attached to capping functional groups, respectively labelled (a), (b) and (c)
Figure 19:
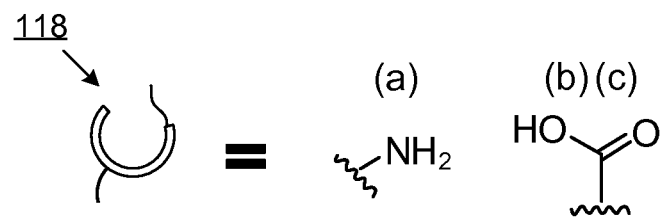
FIG. 19 depicts the terminal groups 118 remaining after removal of the respective capping functional groups.

FIG. 18 depicts three example terminal groups attached to capping functional groups, respectively labelled (a) carbamate, (b) 1,3-dithiane ester, and (c) benzyl ester. FIG. 19 depicts the terminal groups 118 remaining after the removal of the capping functional group 116 in each case: namely, primary amine resulting from (a) and carboxylate resulting from (b) and (c).

Figure 21:
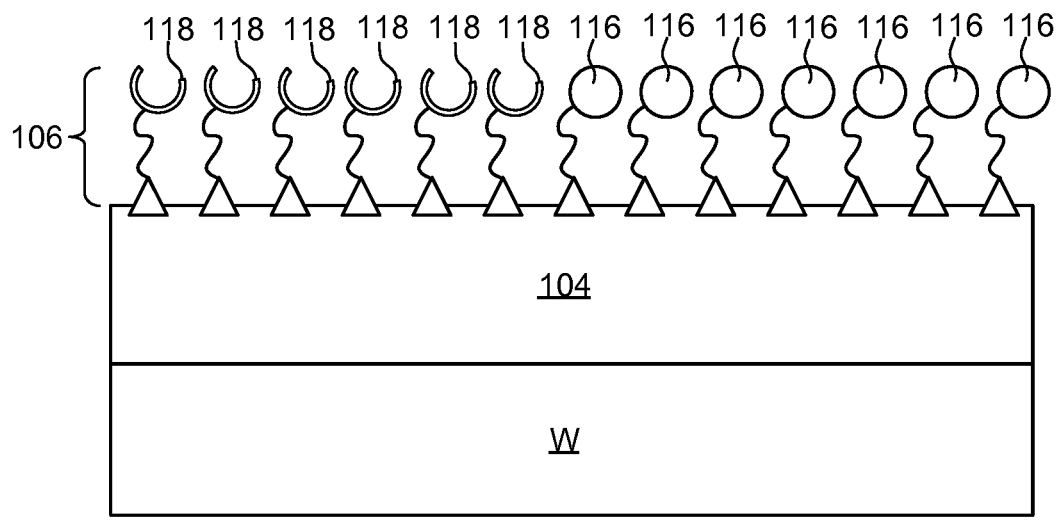
FIG. 21 is a schematic side sectional view of the arrangement of FIG. 20 after the irradiation, with the monolayer of material being modified to remove capping functional groups from organic molecules in the selected region.
Figure 22:
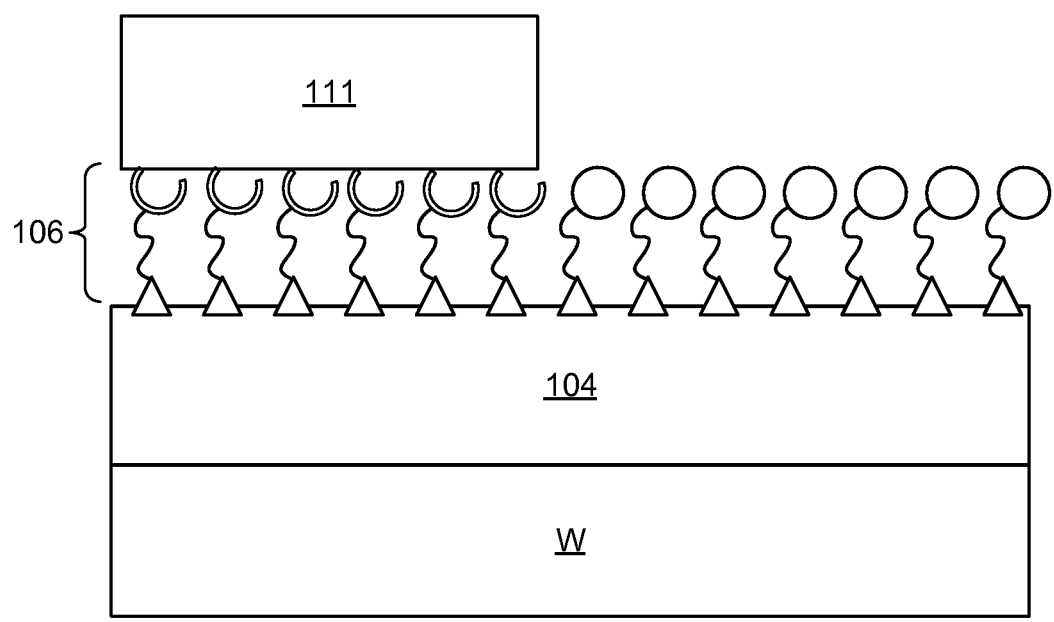
FIG. 22 is a schematic side sectional view of the arrangement of FIG. 21 after growth of a barrier layer 111 in the selected region.

FIGS. 20-22 depict a variation in which the absorption layer 104 comprises a metal oxide ($MO_x$) rather than a metal (as in the examples of FIGS. 11-19). A different anchoring functional group 112B is thus used in this case to attach the organic molecules to the absorption layer 104 (e.g. a silane or phosphate group rather than a thiol group). For embodiments of this type, the covalent (irreversible) type of anchoring provided by the silane group is likely to favour approaches such as that of FIGS. 15-17 (involving removal of a capping functional group 116) over approaches such as that of FIGS. 11-14 (where molecules need to be detached from the absorption layer 104 during an exchange process).

In comparison with tradition photoresist materials, the embodiments discussed above with reference to FIGS. 11-22 effectively separate the required functionalities of a photoresist between three different materials. The absorption layer 104 provides the function of absorbing radiation. The monolayer of material 106 provides the chemical contrast. The barrier layer 111 provides the etch resistance. In traditional photoresist materials all three functionalities have to be provided by a single material. Separating the functionalities between three materials makes tuning of the performance more flexible, making it easier to meet the challenging demands of EUV lithography. Considerable freedom is allowed, for example, in how the barrier layer 111 can be configured, with variations being possible in density, thickness, and/or chemical composition. Furthermore, the effective thickness of the photoresist, for the purposes of defining the pattern, is decreased to a single molecule thickness of the monolayer of material 106, or a thin interface region between the monolayer of material 106 and the absorption layer 104, such that even very small depths of focus should not negatively affect performance significantly.

Further embodiments are disclosed in the subsequent numbered clauses:

1. A method of forming a patterned layer of carbon, comprising:
   irradiating a selected portion of a surface of a solid structure with extreme ultraviolet radiation in the presence of a carbon-containing precursor, wherein:
   the radiation interacts with the solid structure in the selected portion to cause formation of a layer of carbon in the selected portion from the carbon-containing precursor, the layer of carbon being thereby formed in a pattern defined by the selected portion.

2. The method of clause 1, wherein the layer of carbon comprises graphene.

3. The method of clause 1 or 2, wherein:
   the irradiation generates photo-electrons from the solid structure;
   the photo-electrons catalyse a reaction involving the carbon-containing precursor; and
   the reaction causes the formation of the layer of carbon by deposition.

4. The method of any preceding clause, wherein the carbon-containing precursor comprises a gas.

5. The method of any preceding clause, wherein the carbon-containing precursor comprises a hydrocarbon.

6. The method of any preceding clause, wherein the carbon-containing precursor comprises one or more of the following: one or more alkanes; one or more alkynes.

7. The method of any preceding clause, wherein the carbon-containing precursor comprises a solid-state film on the surface of the solid structure.

8. The method of clause 7, wherein the solid-state film is formed by atomic layer deposition, evaporation, or spin coating.

9. The method of clause 7 or 8, wherein the solid-state film comprises one or more of the following: pentacene and polystyrene.

10. The method of any of clauses 7-9, wherein the irradiation transforms the solid-state film in the selected portion into an intermediate state, the intermediate state being transformable into graphene by subsequent heating and, optionally, the method comprising performing the subsequent heating to transform the irradiated solid-state film in the selected portion into graphene and not to transform the solid-state film outside of the selected portion into graphene, thereby providing a layer of graphene in a pattern defined by the irradiation.

11. The method of any preceding clause, further comprising heating the layer of carbon formed by the irradiation in the selected portion to transform the layer of carbon into graphene or, in the case where the layer of carbon comprises graphene, to increase a quality of the layer of graphene.

12. The method of any preceding clause, wherein the solid structure comprises one or more of the following: a metal, a metal carbide, a metal oxide, a semiconductor, Si, $SiO_2$ and SiC.

13. The method of any preceding clause, wherein the extreme ultraviolet radiation comprises radiation having a wavelength in the range of 4 nm to 20 nm.

14. An apparatus for forming a patterned layer of carbon, comprising:
    an irradiation system configured to irradiate a selected portion of a surface of a solid structure with extreme ultraviolet radiation; and an environment control system configured to control an environment including the selected portion of the surface of the solid structure such that the selected portion can be irradiated in the presence of a gaseous carbon-containing precursor.

15. The apparatus of clause 14, wherein the irradiation system comprises a lithographic apparatus configured to provide the irradiation of the selected portion of the solid structure by projecting a patterned radiation beam from a patterning device onto the solid structure.

16. A method of forming a patterned layer of material, comprising:
irradiating with extreme ultraviolet radiation a selected region of an absorption layer and a monolayer of material formed on the absorption layer, wherein:
the radiation interacts with the absorption layer to generate either or both of photo-electrons and hot electrons at an interface between the monolayer of material and the absorption layer that modify the monolayer of material in the selected region; and
the method further comprises using a difference in properties in the selected region caused by the modification to form a barrier layer on the monolayer of material in a pattern defined by the selected region.

17. The method of clause 16, further comprising performing an etching process in which the absorption layer is removed where the barrier layer is absent and is not removed where the barrier layer is present, thereby forming a patterned layer of material.

18. The method of clause 16 or 17, wherein the monolayer of material comprises a self-assembled monolayer of material.

19. The method of any of clauses 16-18, wherein the absorption layer comprises one or both of the following: a metal and a metal oxide.

20. The method of any of clauses 16-19, wherein the monolayer of material comprises a plurality of organic molecules each having an anchoring functional group, the anchoring functional group being a functional group effective to attach the organic molecules to the absorption layer.

21. The method of clause 20, wherein the absorption layer comprises a metal.

22. The method of clause 21, wherein the metal comprises one or more of the following: Au, Ag, Cd, Zn and Cu.

23. The method of clause 21 or 22, wherein the anchoring functional group comprises a thiol group.

24. The method of clause 20, wherein the absorption layer comprises a metal oxide.

25. The method of clause 24, wherein the metal oxide comprises one or more of the following: indium oxide, tin oxide, indium tin oxide, and titanium oxide.

26. The method of clause 24 or 25, wherein the anchoring functional group comprises a silane group or a phosphate group.

27. The method of any of clauses 16-26, wherein the formation of the barrier layer comprises replacing a first material in the monolayer of material in the selected region with a second material, the replacement being favoured in the selected region by the modification of the monolayer of material in the selected region.

28. The method of clause 27, wherein the formation of the barrier layer further comprises performing a growth process in which either:
the barrier layer grows on the first material and not on the second material; or
the barrier layer grows on the second material and not on the first material.

30. The method of clause 27 or 28, wherein the first material and the second material comprise organic molecules having different terminal functional groups.

31. The method of any of clauses 27-30, wherein the first material and the second material comprise organic molecules having a same anchoring functional group, the anchoring functional group being a functional group effective to attach the organic molecules to the absorption layer.

32. The method of any of clauses 27-31, wherein the replacement of the first material with the second material is performed by immersion in a solution containing the second material.

33. The method of any of clauses 16-26, wherein:
the monolayer of material comprises a plurality of organic molecules each having a capping functional group; and
the modification of the monolayer of material comprises removing the capping functional group from at least a subset of the organic molecules in the selected region.

34. The method of clause 33, wherein the formation of the barrier layer comprises performing a growth process in which the barrier layer grows preferentially in the selected region due to interaction with organic molecules from which the capping functional group has been removed.

35. The method of clause 33, wherein the preferential growth comprises selective deposition of either or both of metal-containing and metal-organic hybrid materials in the selected region.

36. The method of clause 34 or 35, wherein the interaction with organic molecules from which the capping functional group has been removed comprises interaction with one or more of the following terminal functional groups having affinity for metallic species: carboxylates; phosphates; sulfonates; and amines, pyridine, piperidine or other amine-based groups.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:
1. A method comprising:
disposing a solid-state film on a first surface of a solid structure, the solid-state film being a carbon-containing precursor that is pentacene, polystyrene, or carbon-containing aromatic precursor molecules;
interacting an extreme ultraviolet radiation (EUV) beam with a patterning device to form a patterned EUV radiation beam;
irradiating, using the patterned EUV radiation beam, the surface of the solid structure including a selected portion of the solid-state film, wherein the patterned EUV radiation interacts with the selected portion of the solid-state film to cause the selected portion of the solid-state film to transform into an intermediate state prior to heating and wherein the selected portion is defined by the patterned EUV radiation beam; and heating, in a presence of atomic hydrogen, the solid-state film to transform the intermediate state in the selected portion of the solid-state film into a patterned layer of carbon atoms on the first surface of the solid structure and to not transform the solid-state film outside of the selected portion into the patterned layer of carbon atoms, wherein the atomic hydrogen acts to selectively clean away the solid-state film where the solid-state film has not been irradiated.

2. The method of claim 1, wherein the patterned layer of carbon atoms comprises graphene.

3. The method of claim 1, wherein:
the irradiating generates photo-electrons from the solid structure; and
the photo-electrons catalyse a reaction involving the carbon-containing precursor.

4. The method of claim 1, wherein:
the solid-state film is formed by atomic layer deposition, evaporation, or spin coating.

5. The method of claim 4, wherein:
the intermediate state transforms into graphene by the heating,
thereby providing a layer of graphene in a pattern defined by the irradiation.

6. The method of claim 2, further comprising heating the layer of carbon atoms to increase a quality of the layer of graphene.

* * * * *